United States Patent
Kamel et al.

(10) Patent No.: US 6,556,160 B1
(45) Date of Patent: Apr. 29, 2003

(54) CIRCUIT FOR CONVERTING AN ANALOG SIGNAL TO A PWM SIGNAL

(75) Inventors: Ashraf K. Kamel, Kokomo, IN (US); David D. Moller, Westfield, IN (US); Larry R. Hach, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/124,791

(22) Filed: Apr. 17, 2002

(51) Int. Cl.[7] .............................................. H03M 1/12
(52) U.S. Cl. ...................................... 341/143; 341/155
(58) Field of Search ................................ 341/157, 155, 341/120, 158, 143

(56) References Cited

U.S. PATENT DOCUMENTS 5,491,828 A * 2/1996 Intrater ....................... 341/155
5,613,149 A * 3/1997 Afek ........................... 341/155

* cited by examiner

*Primary Examiner*—Brian Young
(74) *Attorney, Agent, or Firm*—Jimmy L. Funke

(57) ABSTRACT

A circuit for converting an analog signal to a PWM signal samples an amplitude of the analog signal at first sampling rate and a second slower sampling rate, and produces corresponding first and second signals. A comparison signal defines a first state when the first signal is greater than the second signal, and otherwise defines a second opposite state. The PWM signal switches from a first signal level to a second signal level when the comparison signal switches from the first state to the second state only if the comparison signal thereafter remains in the second state for a specified delay period, and the PWM signal switches from the second signal level to the first signal level when the comparison signal switches from the second state to the first state only if the comparison signal thereafter remains in the first state for the delay period.

22 Claims, 5 Drawing Sheets

CIRCUIT FOR CONVERTING AN ANALOG SIGNAL TO A PWM SIGNAL

TECHNICAL FIELD

The present invention relates generally to circuitry for converting an analog signal to a PWM signal, and more specifically to such circuitry operable to produce the PWM signal based on detection of peaks and valleys in the analog signal.

BACKGROUND OF THE INVENTION

Many circuit applications are known to exist that require determination of the frequency of an analog signal. In the automotive industry, for example, engine and/or vehicle operation sensors typically produce analog signals that are used by one or more on-board processors to control various aspects of engine and/or vehicle operation. In some cases, the information needed from the analog signal is its operating frequency, which may vary with engine/vehicle operation. One typical example of such a sensor is a rotational speed sensor, such as a wheel speed sensor, which produces an analog speed signal having a frequency that varies as a function of the rotational speed of a rotating component.

One commonly employed technique for determining the frequency of an analog signal requires first converting the analog signal to a digital signal, and then processing the converted digital signal in a known manner to determine its frequency. Such a technique is commonly employed in systems that include a microprocessor, particularly since microprocessors are typically equipped with a number of analog-to-digital (A/D) inputs operable to convert analog signals to digital signals for further processing by the microprocessor.

A number of systems are known to exist that require determination of the frequency of an analog signal, but which either do not have an available A/D microprocessor input or do not have microprocessor at all. While an A/D circuit may be implemented in such systems to convert the analog signal to a corresponding digital signal, such circuits may be cost prohibitive in many applications. Heretofore, a number of non-A/D based circuits have accordingly been developed to convert the analog signal to a pulse width modulated (PWM) signal having a frequency proportional to the frequency of the analog signal. For example, one conventional signal converting circuit is configured to compare the amplitude of the analog signal to a fixed threshold level or levels established near the signal reference level. Another known signal converting circuit is configured to compare the amplitude of the analog signal to a threshold level defined by the signal reference level itself. In both cases, a comparator is typically employed to switch between two different signal levels each time the analog signal crosses the established threshold to produce a pulse width modulated (PWM) output signal having a frequency proportional to the frequency of the analog signal.

One drawback associated with each of the foregoing techniques for converting an analog signal to a PWM signal is that each requires comparison of the analog signal to a fixed threshold at, or near, the signal reference. If the analog signal exhibits an offset sufficiently above or below the fixed threshold, some threshold crossings may not be detected, and inaccurate frequency measurements may accordingly result.

What is therefore needed is a circuit configured to accurately produce a PWM signal defining a frequency proportional to that of an analog signal having both a frequency and amplitude that may vary widely, such that an accurate determination of the frequency of the analog signal may thereafter be made.

SUMMARY OF THE INVENTION

The foregoing shortcomings of the prior art are addressed by the present invention. In accordance with one aspect of the present invention, circuitry for converting an analog signal to a PWM signal comprises a first circuit configured to sample an amplitude of the analog signal at a first rate and produce a first signal corresponding thereto, a second circuit configured to sample the amplitude of the analog signal at a second rate slower than the first rate and produce a second signal corresponding thereto, a third circuit producing a third signal defining a first state when the first signal is greater than the second signal and otherwise defining a second opposite state, and a fourth circuit producing the PWM signal defining a pulse width as a function of a switching rate of the third signal between the first and second states.

In accordance with another aspect of the present invention, circuitry for converting an analog signal to a PWM signal comprises a sampling circuit configured to sample an amplitude of the analog signal at two different rates and produce corresponding first and second signals, a comparison circuit producing a comparison signal defining a first state when the first signal is greater than the second signal and otherwise defining a second opposite state, and a delay circuit producing the PWM signal as a function of the comparison signal and a control signal, the PWM signal switching from a first signal level to a second signal level when the comparison signal switches from the first state to the second state only if the comparison signal thereafter remains in the second state for a delay period defined by the control signal, and the PWM signal switching from the second signal level to the first signal level when the comparison signal switches from the second state to the first state only if the comparison signal thereafter remains in the first state for the delay period.

In accordance with a further aspect of the present invention, circuitry for converting an analog signal to a PWM signal comprises a sampling circuit configured to sample an amplitude of the analog signal and produce a detection signal defining a first state upon detection of a peak in the amplitude of the analog signal, and defining a second opposite state upon detection of a valley in the amplitude of the analog signal, and a delay circuit producing the PWM signal as a function of the detection signal and a control signal, the PWM signal switching from a first signal level to a second signal level when the detection signal switches from the first state to the second state only if the detection signal thereafter remains in the second state for a delay period defined by the control signal, and the PWM signal switching from the second signal level to the first signal level when the detection signal switches from the second state to the first state only if the detection signal thereafter remains in the first state for the delay period.

The present invention provides a circuit for accurately converting an analog signal to a PWM signal even though the amplitude and/or the frequency of the analog signal may vary widely.

The present invention further provides such a circuit operable to accurately convert an analog signal to a PWM signal for further processing by a signal processing circuit operable to process the PWM signal to determine therefrom the frequency of the analog signal.

DESCRIPTION OF THE PREFERRED EMBODIMENT

Figure 1:
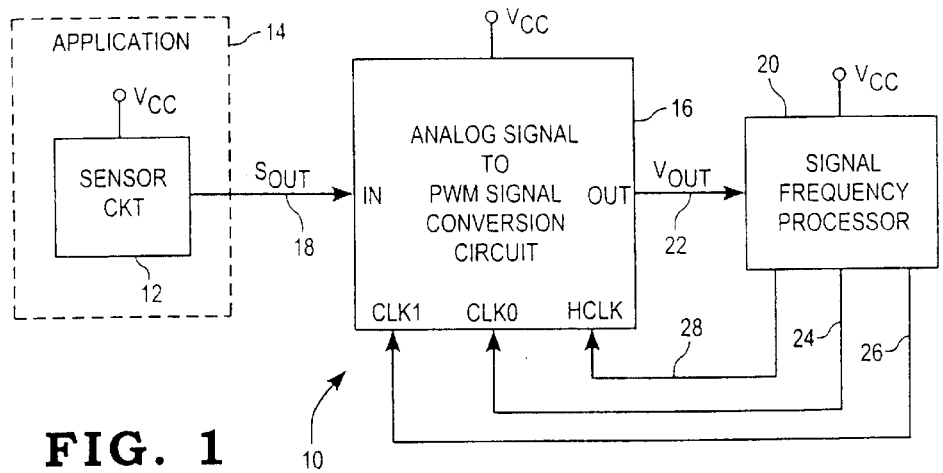
FIG. 1 is a diagrammatic illustration of one preferred embodiment of a system implementing the circuitry of the present invention.
Figure 2:
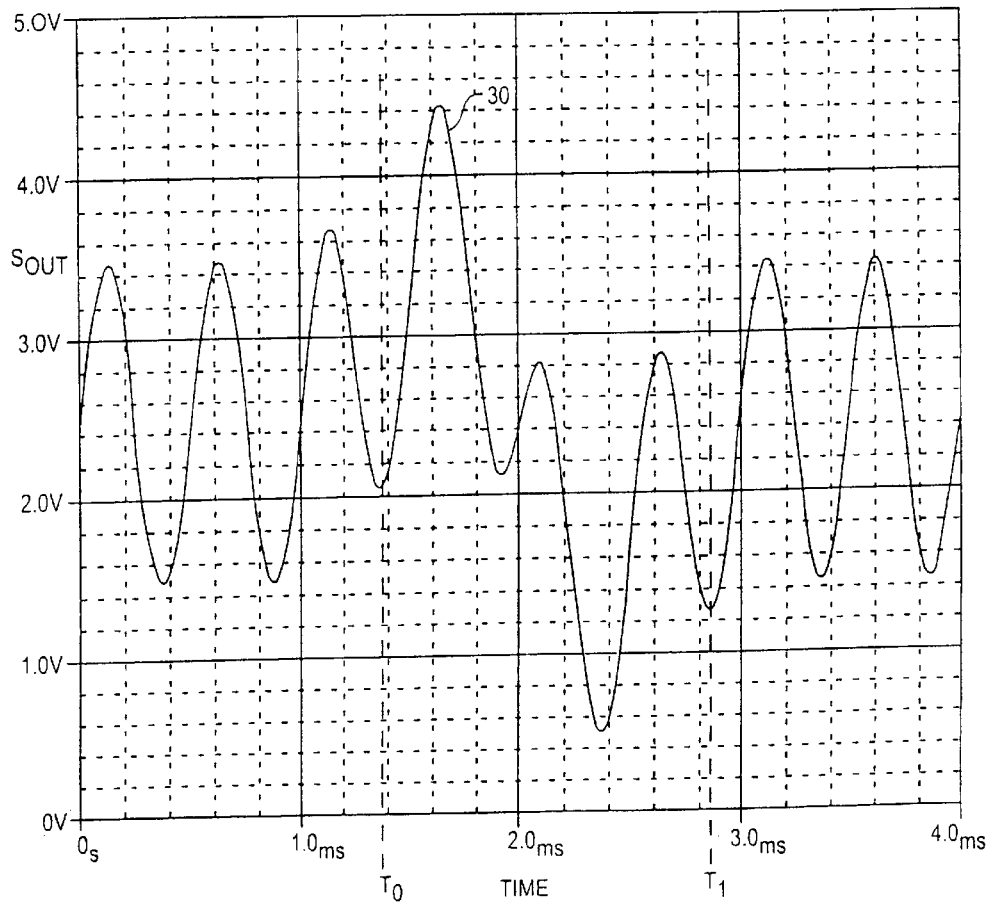
FIG. 2 is a plot of the amplitude of an example analog signal vs. time illustrating variability in both the frequency and amplitude thereof.

Referring now to FIG. 1, a system 10 is shown illustrating one preferred embodiment of an application of the circuit of the present invention. System 10 includes a sensor 12; e.g., a wheel speed sensor, associated with a wheel of a vehicle 14 driven by an internal combustion engine, producing an analog signal $S_{OUT}$ having a frequency indicative of the rotational speed of the vehicle wheel. Sensor 12 may alternatively be any other sensor or sensing system, or other known analog signal source, producing an analog signal for which it is desirable to convert such an analog signal to a PWM signal for further processing. In any case, $S_{OUT}$ may vary widely, both in amplitude and in frequency, and an example $S_{OUT}$ waveform 30, referenced at approximately mid-supply (e.g., 2.5 volts) is illustrated in FIG. 2.

System 10 further includes an analog signal to PWM signal conversion circuit 16, in accordance with the present invention, wherein circuit 16 is operable to process the analog signal, $S_{OUT}$, on signal path 18 in a manner to be described in detail hereinafter, and produce a PWM signal, $V_{OUT}$, at output OUT having a frequency equal to that of the analog signal, $S_{OUT}$. The output OUT of circuit 16 is connected to a signal frequency processor 20 of known construction and operation, via signal path 22, wherein processor 20 is operable to process the PWM signal, $V_{OUT}$, in a known manner to determine the operating frequency thereof. In one embodiment, as shown in FIG. 1, processor 20 is further operable to supply a number of clock signals to circuit 16. For example, processor 20 is operable to supply a first clock signal, CLK0, to a CLK0 input of circuit 16 via signal path 24, to supply a second clock signal, CLK1, to a CLK1 input of circuit 16 via signal path 26, and to supply a third clock signal, HCLK, to an HCLK input of circuit 16 via signal path 30. In an alternative embodiment, any one or more of the clock signals CLK0, CLK1 and/or HCLK may be provided by another clock signal source. In the operation of system 10, circuit 16 of the present invention is operable to convert the analog sensor signal, $S_{OUT}$, to a PWM signal, $V_{OUT}$, and processor 20 is operable to process $V_{OUT}$ in a known manner to determine its frequency. The frequency of $V_{OUT}$ tracks that of $S_{OUT}$, and may consequently vary widely.

Figure 3:
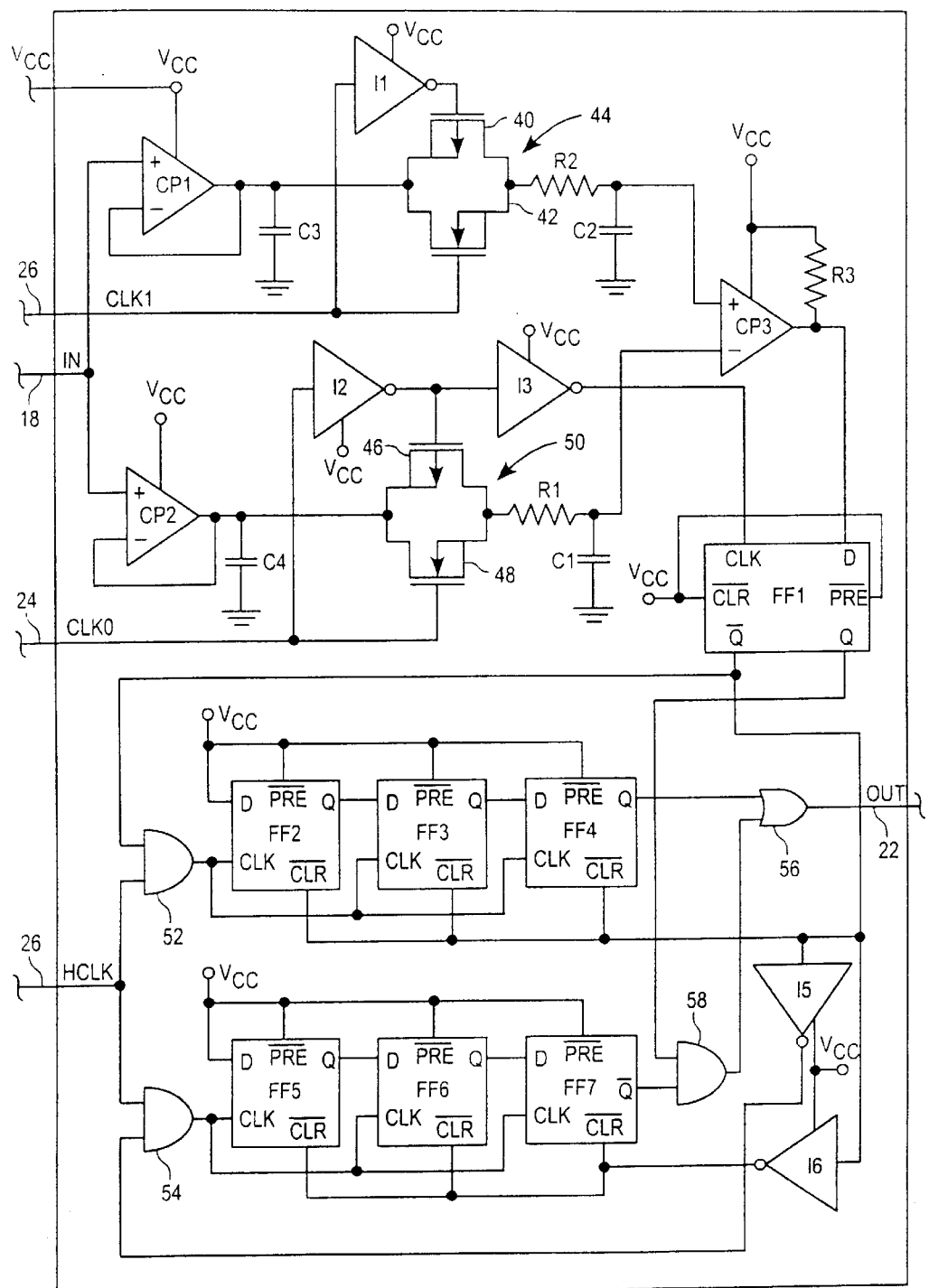
FIG. 3 is a schematic diagram illustrating one preferred embodiment of a circuit for converting an analog signal to a PWM signal, in accordance with the present invention.

Referring now to FIG. 3, a schematic is shown illustrating one preferred embodiment of the circuit 16 of FIG. 1 for converting an analog signal, such as $S_{OUT}$, to a PWM signal, $V_{OUT}$, in accordance with the present invention. Circuit 16 includes a first comparator, CP1, having a non-inverting input receiving the analog signal on signal path 18. CP1 is configured as a voltage follower and has an output connected to an input of a transmission gate 44 and to one end of a noise capacitor C3 referenced at ground potential. CP1 is operable to buffer the analog signal on signal path 26 and provide the buffered analog signal to the input of transmission gate 44.

Transmission gate 44 is formed as a known configuration of transistors 40 and 42, and a gate of transistor 40 is connected to an output of a first inverter, I1, having an input connected to a gate of transistor 42 and to signal path 26. The gate of transistor 42 thus receives the clock signal, CLK1, and the gate of transistor 40 receives the inverse of CLK1 (CLK1bar). Transistor 40 is a p-channel device and transistor 42 is an n-channel device, such that both transistors 40 and 42 are activated by a high CLK1 state to thereby allow passage therethrough of the buffered analog signal produced by comparator CP1, and are deactivate by a low state of CLK1 to thereby disallow passage therethrough of the buffered analog signal produced by comparator CP1. The output of transmission gate 44 is connected to one end of a resistor R2 having an opposite end connected to a non-inverting input of another comparator CP3 and to one end of another capacitor C2 referenced at ground potential. Resistor R2 is included to break or at least minimize any capacitive coupling between capacitances associated with transmission gate 44 and capacitor C2 to thereby minimize feedthrough of clock signal, CLK1, to capacitor C2.

In operation, transmission gate 44 is responsive to a high state of CLK1 to allow the buffered analog signal produced by CP1 to charge the capacitor C2 and thereby define the voltage at the non-inverting input of comparator CP3. Transmission gate 44 is further responsive to a low state of CLK1 to isolate the buffered analog signal produced by CP1 from capacitor C2 so that the voltage defined at the non-inverting input of CP3 while CLK1 was high remains constant while CLK1 is low.

Circuit 16 further includes another comparator, CP2, having a non-inverting input receiving the analog signal on signal path 18. CP2 is configured as a voltage follower and has an output connected to an input of a transmission gate 60 and to one end of a noise capacitor C4 referenced at ground potential. CP2 is operable to buffer the analog signal on signal path 26 and provide the buffered analog signal to the input of transmission gate 50.

As with transmission gate 44, transmission gate 50 is formed as a known configuration of transistors 46 and 48, and a gate of transistor 46 is connected to an output of a second inverter, I2, having an input connected to a gate of transistor 48 and to signal path 24. The gate of transistor 48 thus receives the clock signal, CLK0, and the gate of transistor 46 receives the inverse of CLK0 (CLK0bar).

Transistor 46 is a p-channel device and transistor 48 is an n-channel device, such that both transistors 46 and 48 are activated by a high CLK0 state to allow passage therethrough of the buffered analog signal produced by comparator CP2. The output of transmission gate 50 is connected to one end of a resistor R1 having an opposite end connected to an inverting input of comparator CP3 and to one end of another capacitor C1 referenced at ground potential. Resistor R1 is included to break or at least minimize any capacitive coupling between capacitances associated with transmission gate 50 and capacitor C1 to thereby minimize feedthrough of clock signal, CLK0, to capacitor C1.

In operation, transmission gate 50 is responsive to a high state of CLK0 to allow the buffered analog signal produced by CP3 to charge the capacitor C1 and thereby define the voltage at the inverting input of comparator CP3. Transmission gate 50 is further responsive to a low state of CLK0 to isolate the buffered analog signal produced by CP3 from capacitor C1 so that the voltage defined at the inverting input of CP3 while CLK0 was high remains constant while CLK0 is low.

The output of CP3 is connected via a resistor R3 to supply voltage, VCC, and is also connected to a "D" input of a flip flop circuit F1 of known construction. The output of inverter I2 is connected to the input of another inverter, I3, having an output connected to a clock input, CLK, of flip flop FF1. Active low clear (CLRbar) and preset (PREbar) inputs of flip flop FF1 are each connected to Vcc. Flip flop FF1 defines two complementary outputs, Q and Qbar. In operation, flip flop FF1 is operable to clock to output Q the output state of comparator CP3, and to output Qbar an inverse of the output state of CP3, at a rate defined by the clock signal CLK0.

Figure 4:
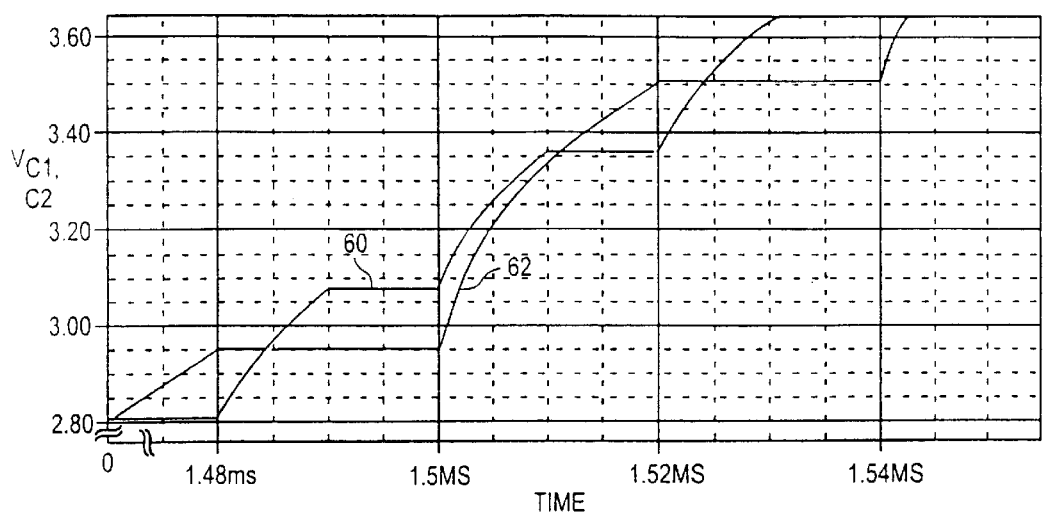
FIG. 4 is a plot of the voltages across capacitors C1 and C2 of FIG. 3 illustrating operation of a portion thereof for an analog signal increasing in amplitude.
Figure 5:
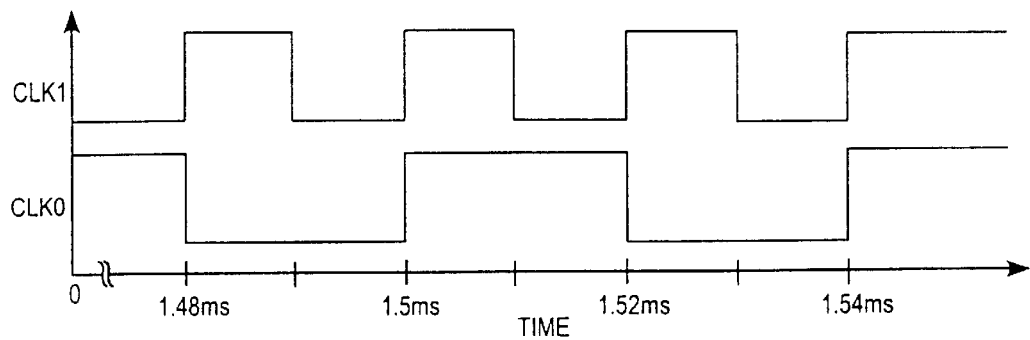
FIG. 5 is a plot of the clock signal timing used to control the charging times of the capacitors C1 and C2 in the plot of FIG. 3.
Figure 6:
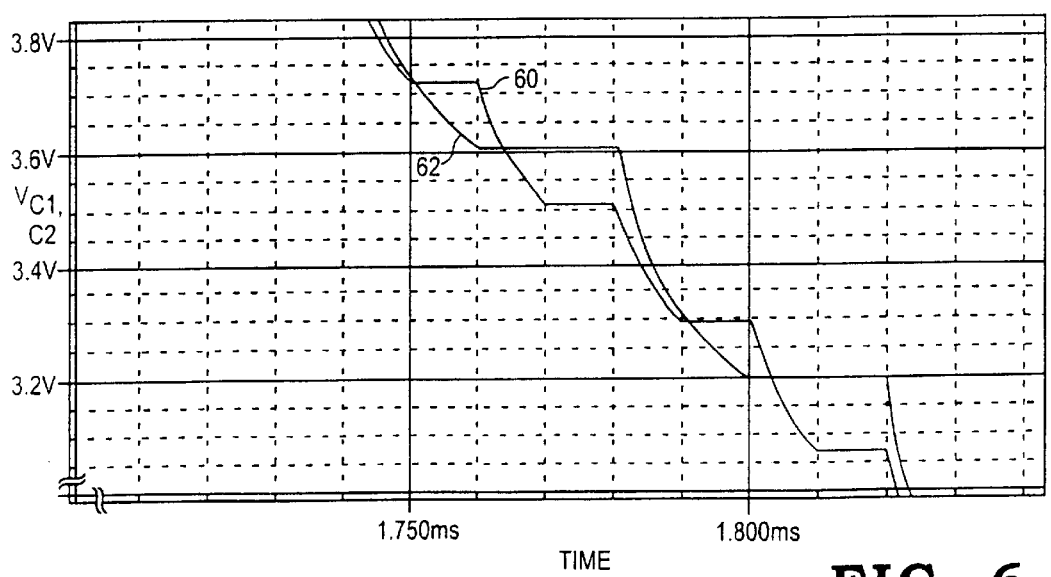
FIG. 6 is a plot of the voltages across capacitors C1 and C2 of FIG. 3 illustrating operation of a portion thereof for an analog signal decreasing in amplitude.

The circuitry of FIG. 3 described thus far is operable to sample the analog signal on signal path 18 at each of two clock rates CLK0 and CLK1. The frequency of CLK0 is slower than that of CLK1 such that the voltage across capacitor C1 always represents an amplitude of the analog signal that lags that defined across capacitor C2. Capacitor C1 is accordingly used to create a variable reference for comparison via CP3 with a later-sampled amplitude value of the analog signal. Referring to FIGS. 4, 5 and 6, the operation of the circuitry of FIG. 3 described thus far is illustrated. FIG. 4 is a plot of the voltage 60 across capacitor C2 and the voltage 62 across capacitor C1 vs. time for a smoothly increasing analog input signal, and FIG. 5 is a plot of one preferred embodiment of the clock signals CLK0 and CLK1 vs. time, wherein the time axes of FIGS. 4 and 5 are synchronized. In one embodiment, the frequency of CLK1 is set at twice that of CLK0 so that the amplitude of the analog signal stored in capacitor C1 always lags, in phase, amplitude of the analog signal stored in capacitor C2, although the present invention contemplates other frequency ratios of the clock signals CLK0 and CLK1. It is further desirable to set the frequency of the slowest clock, CLK0, to higher than twice the maximum frequency of the analog signal on signal path 18 to ensure acceptable accuracy of the PWM output signal, $V_{OUT}$.

In any case, it can be seen from FIG. 4 that while the amplitude of the analog signal is smoothly increasing, as shown by example in FIG. 2, the voltage 60 across capacitor C2 is always greater than the voltage 62 across capacitor C1 when the clock signal CLK0 transitions from a low state to a high state. The output of comparator CP3 is accordingly high throughout the duration of the plot illustrated in FIG. 4. The Q output of FF1 is thus set to a high state, and the Qbar output set to a low state, throughout the this duration. In contrast to FIG. 4, FIG. 6 illustrates the voltage 60 across capacitor C2 and the voltage 62 across capacitor C1 vs. time for a smoothly decreasing analog input signal. While the time axis of FIG. 6 is not synchronized with that of FIGS. 4 and 5, it should be understood that while the amplitude of the analog signal is smoothly decreasing, as shown by example, in FIG. 2, the voltage 60 across capacitor C2 is always less than the voltage 62 across capacitor C1 when the clock signal CLK0 transitions from a low state to a high state (corresponding to the end of any constant-valued region of signal 62). The output of comparator CP3 is accordingly set to a low state throughout the duration of the plot illustrated in FIG. 6. The Q output of FF1 is thus set to a low state, and the Qbar output set to a high state, throughout this duration.

Figure 7:
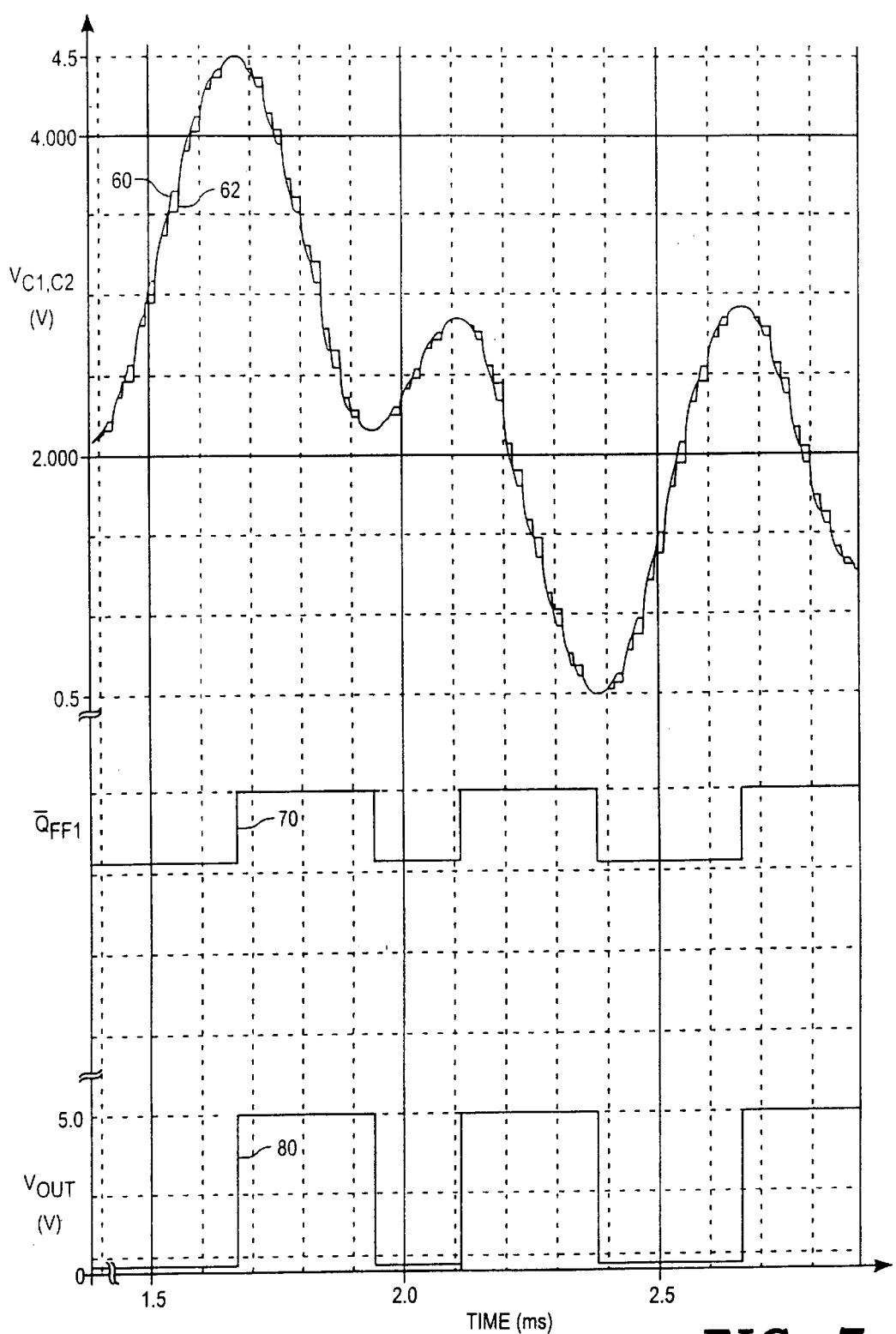
FIG. 7 is a plot of the voltages across capacitors C1 and C2 of FIG. 3, the circuit output signal and an internal circuit signal illustrating operation of the circuit of the present invention.

As just described, the Q output of FF1 is continually set to a high state as long as the analog input signal is smoothly increasing, and is continually set to a low state as long as the analog signal is smoothly decreasing. When the analog signal reaches a peak, the Q output of FF1 will thus switch from a high state to a low state, and when the analog signal reaches a valley, the Q output of FF1 will switch from a low state to a high state. The Qbar output of FF1 will be the inverse of the Q output just described, and therefore defines a rising edge upon detection of a peak in the analog input signal and a falling edge upon detection of a valley in the analog input signal. Referring to FIG. 7, plots of the voltages 60 and 62 across capacitors C1 and C2 respectively, as well as the Qbar output 70 of FF1, for a section of the analog input signal defined between times T0 and T1 of FIG. 2, illustrate the operation just described. The PWM output, $V_{OUT}$, 80 of circuit 16 is also shown in FIG. 7 to illustrate that $V_{OUT}$ generally tracks the Qbar output of FF1 with the exception of a slight delay between the rising edge of signal 70 and the rising edge of signal 80, and between the falling edge of signal 70 and the falling edge of signal 80, as will be described subsequently.

Referring again to FIG. 3, the Qbar output of FF1 is provided to one input of a first AND gate 52 having a second input receiving the clock signal HCLK on signal path 26. The output of AND gate 52 is connected to clock inputs, CLK, of a number of cascaded flip flop circuits FF2, FF3 and FF4 of known construction. The D input and active low preset input PREbar of FF1 are connected to VCC, and a Q output of FF1 is connected to the D input of FF3. The Q output of FF3 is likewise connected to the D input of FF4 having its Q output connected to one input of an OR gate 56. As with FF2, the active low preset inputs PREbar of FF3 and FF4 are connected to VCC, and the active low clear inputs, CLRbar of FF3, FF4 and FF5 are each connected to the Qbar output of FF1.

The Qbar output of FF1 is also provided to an input of an inverter, I5, having an output connected to one input of a second AND gate 54, wherein AND gate 54 has a second input receiving the clock signal HCLK on signal path 26. The output of AND gate 54 is connected to clock inputs, CLK, of another number of cascaded flip flop circuits FF5, FF6 and FF7 of known construction. The D input and active low preset input PREbar of FF5 are connected to VCC, and a Q output of FF5 is connected to the D input of FF6. The Q output of FF6 is likewise connected to the D input of FF7 having its Q output connected to one input of another AND gate 58. As with FF5, the active low preset inputs PREbar of FF6 and FF7 are connected to VCC, and the active low clear inputs, CLRbar of FF5, FF6 and FF7 are each connected through an inverter, I6, to the Qbar output of FF1.

The Q output of FF1 is connected to a remaining input of AND gate 58, and the output of AND gate 58 is connected to the remaining input of OR gate 56. The output of OR gate 56 defines the output OUT of circuit 56.

The circuitry just described implements a hysteresis timer operable to delay production of the output of FF1 at the PWM output, OUT, of circuit 16, depending upon the value of the hysteresis clock, HCLK, when the output of FF1 changes state. A typical value for the period of the hysteresis clock, HCLK, may be, for example, 20 microseconds, although the present invention contemplates other HCLK period values. The hysteresis allows the signal to hold its previous value until a valid peak or valley is confirmed so that noise spikes and other false peaks and valleys will not trigger a change in state of the PWM output signal, $V_{OUT}$, and thereby corrupt the signal. The frequency of the hysteresis clock, HCLK, defines the hysteresis delay time, and can be selected to suit the particular application.

Figure 8:
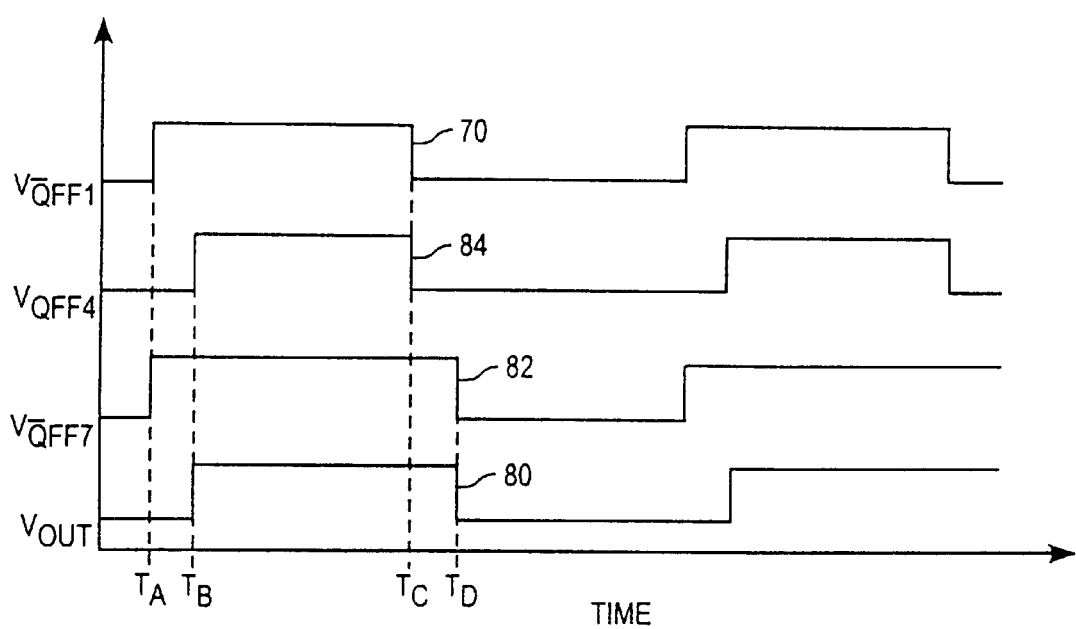
FIG. 8 is a plot of some of the internal signals generated by the circuit of FIG. 3 further illustrating operation of the circuit of the present invention.

The operation of the hysteresis timer of FIG. 3 will be described with respect to FIG. 8 which illustrates the following signals; the Qbar output of FF1 70, the Q output of FF4 84, the Qbar output of FF7 82 and the PWM output signal, $V_{OUT}$ 80. Assume that the analog input signal has just confirmed a valid valley and is increasing toward a peak. In this case, Qbar of FF1 (signal 70) is set to a low state, the Q output of FF1 is set to a high state, the CLRbar inputs of FF2, FF3 and FF4 have been activated, and the Q output of FF4 (signal 84) therefore set to a low state. The CLRbar inputs of FF5, FF6 and FF7 have been deactivated, and the hysteresis clock HCLK has operated more than two full clock cycles so that the Qbar output of FF7 (signal 82) is low, and the output of AND gate 58 is therefore set to a low state. With both inputs to the AND gate 56 set low, the PWM output $V_{OUT}$ is likewise low.

At time $T_A$, a peak in the analog input signal is detected, and the Qbar output of FF1 (signal 70) transitions to a high state. Through I6, this activates the CLRbar inputs of FF5, FF6 and FF7 so that the Qbar output of FF7 also transitions to a high state. The Q output of FF1 has just transitioned to a low state, so the output of AND gate 58 is low. The transition of the Qbar output of FF1 (signal 70) to a high state disables the CLRbar inputs of FF2, FF3 and FF4, and the hysteresis clock, HCLK, begins to propagate the high Q output of FF2 through FF3 and FF4. At time $T_B$, the high Q output of FF2 has propagated to the D input of FF4 so that the Q output of FF4 (signal 84) switches high, thereby confirming a valid peak. The output of OR gate 56, corresponding to the PWM output signal, $V_{OUT}$, (signal 80) then switches high. Had the Qbar output of FF1 (signal 70) not remained high for the time that it took the hysteresis clock, HCLK, to propagate the high Q output of FF2 to the Q output of FF4, a low Qbar output of FF1 would have cleared FF2–FF4, and the Q output of FF4 would therefore have stayed low. Because the output of AND gate 58 was already low, the PWM output, $V_{OUT}$ of circuit 16 (signal 80) likewise would not have switched high. The hysteresis timer thus acts to filter out false peaks from the PWM output signal, $V_{OUT}$, as long as such false peaks have a duration that is shorter than two clock cycles of the hysteresis clock, HCLK.

At time $T_C$, a valley in the analog input signal is detected, and the Qbar output of FF1 (signal 70) transitions to a low state. This activates the CLRbar inputs of FF2, FF3 and FF4 so that the Q output of FF4 also transitions to a low state. Since the Q output of FF1 switches high with the transition of the Qbar output of FF1 to a low state, and since the previously cleared FF5, FF6 and FF7 set the Qbar output of FF7 (signal 82) to a high state, the output of AND gate 58 likewise switches high, thereby maintaining the PWM output, $V_{OUT}$, of circuit 16 high. The transition of the Qbar output of FF1 (signal 70) to a low state disables the CLRbar inputs of FF5, FF6 and FF7, and the hysteresis clock, HCLK, begins to propagate the high Q output of FF5 through FF6 and FF7. At time $T_D$, the high Q output of FF2 has propagated to the D input of FF7 so that the Qbar output of FF7 (signal 82) switches low, thereby confirming a valid valley. The output of AND gate 58 switches low with the transition of the Qbar output of FF7 to a low state, and the output of OR gate 56, corresponding to the PWM output signal, $V_{OUT}$, (signal 80) accordingly switches low. Had the Qbar output of FF1 (signal 70) not remained low for the time that it took the hysteresis clock, HCLK, to propagate the high Q output of FF2 to the low Qbar output of FF7, a high Qbar output of FF1 would have disabled the CLRbar inputs of FF2–FF4 and allowed FF2–FF4 to propagate the high Q output of FF2 to the Q output of FF4 to thereby maintain the PWM output, $V_{OUT}$ of circuit 16 in a high state. The hysteresis timer thus acts to filter out false valleys from the PWM output signal, $V_{OUT}$, as long as such false valleys have a duration that is shorter than two clock cycles of the hysteresis clock, HCLK.

In cases where the frequency of the analog input signal is sufficiently high, the foregoing hysteresis filter circuit serves as a reliable noise filter as just described. However, in applications wherein the frequency of the analog input signal may be very low, correspondingly low frequency noise on the analog signal may be sufficiently long in duration so as to outlast the filtering time set by the hysteresis clock, HCLK. In such cases, it may be desirable to include additional hysteresis circuitry in the circuit 16 of FIG. 3, wherein such additional circuitry is operable to provide additional noise filtering at low frequencies. For example, the noise filtering function of the hysteresis filter just described may be improved by additionally including a comparator circuit producing an analog difference signal corresponding to the difference between the voltage across capacitor C2 and the voltage across the capacitor C1, and comparing this analog difference signal to a programmable voltage threshold. Typical values for the programmable voltage threshold may be, for example, in the range of 20–100 millivolts, although the present invention contemplates other values for the programmable voltage threshold. In any case, further circuitry may be included that is operable to determine that a valid peak or valley has occurred only if the analog difference signal is found to be greater than the programmable threshold for the time filter period. Those skilled in the art will recognize that such circuitry may take many forms, and implementation of such circuitry within circuit 16 would be a mechanical step for a skilled circuit designer.

The analog signal to PWM signal conversion circuit of the present invention is operable to track peaks and valleys of an analog signal through the use a variable threshold sampled from the analog signal itself. This is accomplished by switching two capacitors, C1 and C2, between sample and hold of the analog signal at two different clock rates, thereby allowing one analog signal sample to always lead the other. The two analog signal samples are continually updated and compared with each other to allow the circuit to determine instantaneously whether the analog signal is increasing or decreasing in amplitude. To filter out noise glitches associated with the analog signal that may cause the output to switch in response thereto, a programmable hysteresis is implemented. A hysteresis timer monitors the output of the analog signal sample comparison circuitry, and a change in state thereof is considered indicative of a valid peak or valley only if it is longer than the time filter set by a hysteresis clock.

While the invention has been illustrated and described in detail in the foregoing drawings and description, the same is to be considered as illustrative and not restrictive in character, it being understood that only preferred embodiments thereof have been shown and described and that all changes and modifications that come within the spirit of the invention are desired to be protected. For example, while the concepts of the present invention have been described hereinabove in the context of an automotive environment wherein the analog signal source is an automotive operating parameter sensor, it is to be understood that this description was provided only by way of example. Those skilled in the art will accordingly recognize that the concepts of the present invention may be extended to other applications and/or other analog signal sources, and any such applications and/or other analog signal sources are intended to tall within the scope of the present invention.

What is claimed is:

1. Circuitry for converting an analog signal to a PWM signal, the circuit comprising:
    a first circuit configured to sample an amplitude of the analog signal at a first rate and produce a first signal corresponding thereto;
    a second circuit configured to sample the amplitude of the analog signal at a second rate slower than said first rate and produce a second signal corresponding thereto;
    a third circuit producing a third signal defining a first state when said first signal is greater than said second signal and otherwise defining a second opposite state; and
    a fourth circuit producing the PWM signal defining a pulse width as a function of a switching rate of said third signal between said first and second states.

2. The circuitry of claim 1 wherein said first circuit includes:
    a first transmission gate having an input receiving the analog signal and an output; and
    a first capacitor having one end connected to said output of said first transmission gate;
    and wherein said first transmission gate is responsive to a first clock signal operating at said first rate to periodically charge said first capacitor with the amplitude of the analog signal to thereby produce said first signal.

3. The circuitry of claim 2 wherein said second circuit includes:
    a second transmission gate having an input receiving the analog signal and an output; and
    a second capacitor having one end connected to said output of said second transmission gate;
    and wherein said second transmission gate is responsive to a second clock signal operating at said second rate to periodically charge said second capacitor with the amplitude of the analog signal to thereby produce said second signal.

4. The circuitry of claim 3 wherein said third circuit includes:
    a comparator having a first input receiving the first signal, a second input receiving the second signal and an output; and
    a latch circuit having a signal input connected to said output of said comparator, a clock input receiving the second clock signal and an output producing said third signal at a rate defined by the second clock signal.

5. The circuitry of claim 4 wherein said fourth circuit is responsive to said third signal and a control signal to switch the PWM signal from a first signal level to a second signal level when said third signal switches from said first state to said second state only if said third signal thereafter remains in said second state for a delay period defined by said control signal, and to switch the PWM signal from said second signal level to said first signal level when said third signal switches from said second state to said first state only if said third signal thereafter remains in said first state for said delay period.

6. The circuitry of claim 5 further including a signal processing circuit configured to process said PWM signal and determine therefrom a frequency of the analog signal.

7. The circuitry of claim 6 wherein said signal processing circuit is operable to produce said first clock signal, said second clock signal and said control signal.

8. The circuitry of claim 6 further including a sensor producing the analog signal.

9. The circuitry of claim 8 wherein said sensor is associated with one of a vehicle carrying an internal combustion engine and said internal combustion engine.

10. The circuitry of claim 9 wherein said sensor is a wheel speed sensor;
    and wherein said analog signal corresponds to a rotational speed of a wheel forming part of said vehicle.

11. Circuitry for converting an analog signal to a PWM signal, the circuit comprising:
    a sampling circuit configured to sample an amplitude of the analog signal at two different rates and produce corresponding first and second signals;
    a comparison circuit producing a comparison signal defining a first state when said first signal is greater than said second signal and otherwise defining a second opposite state; and
    a delay circuit producing the PWM signal as a function of said comparison signal and a control signal, the PWM signal switching from a first signal level to a second signal level when said comparison signal switches from said first state to said second state only if said comparison signal thereafter remains in said second state for a delay period defined by said control signal, and the PWM signal switching from said second signal level to said first signal level when said comparison signal switches from said second state to said first state only if said comparison signal thereafter remains in said first state for said delay period.

12. The circuitry of claim 11 wherein said sampling circuit includes:
    first and transmission gates each having an input receiving the analog signal and an output;
    a first capacitor having one end connected to said output of said first transmission gate; and
    a second capacitor having one end connected to said output of said second transmission gate;
    and wherein said first transmission gate is responsive to a first clock signal operating at a first clock rate to periodically charge said first capacitor with the amplitude of the analog signal to thereby produce said first signal;
    and wherein said second transmission gate is responsive to a second clock signal operating at a second clock rate slower than said first clock rate to periodically charge said second capacitor with the amplitude of the analog signal to thereby produce said second signal.

13. The circuitry of claim 12 wherein said comparison circuit includes:
    a comparator having a non-inverting input receiving the first signal, an inverting input receiving the second signal and an output; and a latch circuit having a signal input connected to said output of said comparator, a clock input receiving the second clock signal and an output producing said comparison signal at a rate defined by the second clock signal.

14. The circuitry of claim 13 further including a signal processing circuit configured to process said PWM signal and determine therefrom a frequency of the analog signal.

15. The circuitry of claim 11 further including a sensor producing the analog signal.

16. The circuitry of claim 15 wherein said sensor is associated with one of a vehicle carrying an internal combustion engine and said internal combustion engine.

17. The circuitry of claim 16 wherein said sensor is a wheel speed sensor;

and wherein said analog signal corresponds to a rotational speed of a wheel forming part of said vehicle.

18. Circuitry for converting an analog signal to a PWM signal, the circuit comprising:

a sampling circuit configured to sample an amplitude of the analog signal and produce a detection signal defining a first state upon detection of a peak in the amplitude of the analog signal, and defining a second opposite state upon detection of a valley in the amplitude of the analog signal; and a delay circuit producing the PWM signal as a function of said detection signal and a control signal, the PWM signal switching from a first signal level to a second signal level when said detection signal switches from said first state to said second state only if said detection signal thereafter remains in said second state for a delay period defined by said control signal, and the PWM signal switching from said second signal level to said first signal level when said detection signal switches from said second state to said first state only if said detection signal thereafter remains in said first state for said delay period.

19. The circuitry of claim 18 wherein said sampling circuit includes:

first and transmission gates each having an input receiving the analog signal and an output;

a first capacitor having one end connected to said output of said first transmission gate;

a second capacitor having one end connected to said output of said second transmission gate;

a comparator having a first input connected to said one end of said first capacitor, a second input connected to said one end of said second capacitor and an output; and a latch circuit having a signal input connected to said output of said comparator and an output producing said detection signal;

and wherein said first transmission gate is responsive to a first clock signal operating at a first clock rate to periodically charge said first capacitor with the amplitude of the analog signal;

and wherein said second transmission gate is responsive to a second clock signal operating at a second clock rate slower than said first clock rate to periodically charge said second capacitor with the amplitude of the analog signal;

and wherein said latch is responsive to the second clock signal to produce said detection signal at a rate defined by said second clock rate.

20. The circuitry of claim 19 further including a signal processing circuit configured to process said PWM signal and determine therefrom a frequency of the analog signal.

21. The circuitry of claim 18 further including a sensor is associated with one of a vehicle carrying an internal combustion engine and said internal combustion engine, said sensor producing the analog signal.

22. The circuitry of claim 21 wherein said sensor is a wheel speed sensor;

and wherein said analog signal corresponds to a rotational speed of a wheel forming part of said vehicle.

\* \* \* \* \*